United States Patent [19]

Danielsons

[11] Patent Number: 5,850,162
[45] Date of Patent: Dec. 15, 1998

[54] LINEARIZATION OF AN AMPLIFIER EMPLOYING MODIFIED FEEDFORWARD CORRECTION

[75] Inventor: David Christopher Danielsons, Hannibal, Mo.

[73] Assignee: Harris Corporation, Melbourne, Fla.

[21] Appl. No.: 803,222

[22] Filed: Feb. 20, 1997

[51] Int. Cl.⁶ ................................................. H03F 1/26
[52] U.S. Cl. .................................... 330/149; 330/151
[58] Field of Search .................................. 330/149, 151; 455/115, 118

[56] References Cited

U.S. PATENT DOCUMENTS

| | | | |
|---|---|---|---|
| 3,471,798 | 10/1969 | Seidel | 330/151 |
| 4,348,642 | 9/1982 | Harrington | 330/149 |
| 4,352,072 | 9/1982 | Harrington | 330/149 |
| 4,595,882 | 6/1986 | Silagi et al. | 330/151 |
| 5,570,063 | 10/1996 | Eisenberg | 330/149 |

OTHER PUBLICATIONS

An article by Edward G. Silagi entitled "Ultra–Low–Distortion Power Amplifiers" found in Chapter 13, pp. 448–472 in a book entitled *Single–SideBand Systems and Circuits* edited by W. E. Sabin and E. O. Schoenlike, McGraw–Hill, Inc. 1987.

*Primary Examiner*—Steven Mottola
*Attorney, Agent, or Firm*—Tarolli, Sundheim, Covell, Tummino & Szabo

[57] ABSTRACT

An output amplifier having a non-linear signal response characteristic is linearized by selecting a preceding amplifier in a multistage amplifier network and providing feedforward overcorrection to the preceding amplifier to compensate for the non-linear signal response characteristics of the output amplifier.

15 Claims, 3 Drawing Sheets

LINEARIZATION OF AN AMPLIFIER EMPLOYING MODIFIED FEEDFORWARD CORRECTION

BACKGROUND OF THE INVENTION

Feedforward correction of an amplifying means to correct for non-linear signal response characteristics is known. Reference may be made to an article by Edward G. Silagi entitled "Ultra-Low-Distortion Power Amplifiers" found in Chapter 13, pages 448–472 in a book entitled "Single-Sideband Systems and Circuits" edited by W. E. Sabin and E. O. Schoenike, McGraw-Hill, Inc. 1987. As pointed out in that article, feedforward correction typically includes obtaining a sample of an input signal to an amplifier and comparing that with a sample taken from the output of the amplifier to obtain an error signal. The error signal represents the non-linear signal response characteristics (noise and distortion) of the amplifier. This error signal is then combined with the output signal of the amplifier in a direction to cause the output signal to be linearly related to the input signal. Other references disclosing feedforward correction for amplifiers include the following: U.S. Pat. Nos. to H. Seidel 3,471,798, T. A. Harrington 4,348,642, T. A. Harrington 4,352,072, and M. W. Heidt and E. G. Silagi 4,595,882.

The above described feedforward correction of an amplifier functions to correct the non-linearity characteristics of that amplifier but does not provide any improvement for the non-linear signal response characteristics of a succeeding or output amplifier. This succeeding or output amplifier may have a non-linear signal response characteristic that requires correction. Also, if the output amplifier operates at a high power level, it may not be economical to employ feedforward correction with the output amplifier because feedforward correction typically causes a loss of upwards of ¼ to ½ of the power.

SUMMARY OF THE INVENTION

It is an object of the present invention to improve the linearity of an output amplifier having a non-linear signal response characteristic by providing feedforward overcorrection to a preceding amplifier.

In accordance with the present invention, an output amplifier having a non-linear signal response characteristic and located in a multi-stage amplifier network between a signal source and a load is linearized by providing feedforward correction to a preceding amplifier. This is accomplished by selecting a preceding amplifier within the amplifier network and wherein the selected preceding amplifier exhibits a non-linear response characteristic similar to that of the output amplifier. The input signal is applied to the selected amplifier to generate an intermediate output signal therefrom in which the intermediate output signal normally exhibits a signal difference from that of the input signal as a function of the non-linear signal response characteristic of the selected amplifier. At least a portion of the input signal is combined with at least a portion of the intermediate output signal to obtain an error signal which represents the signal difference. The error signal is combined with the intermediate output signal in a manner to obtain a corrected intermediate output signal. The corrected intermediate output signal is applied to the output amplifier to obtain an output signal therefrom. The error signal is adjusted in a direction to provide an overcorrected intermediate output signal which has been overcorrected by an amount sufficient to compensate for the non-linear signal response characteristic of the output amplifier whereby the output signal from the output amplifier is essentially linearly related to the input signal.

BRIEF DESCRIPTION OF THE DRAWINGS

The foregoing and other advantages of the invention will become more readily apparent from the following description of the preferred embodiment of the invention as taken in conjunction with the accompanying drawings, which are a part hereof, and wherein.

DESCRIPTION OF THE PREFERRED EMBODIMENTS

The invention herein is directed toward linearizing an output amplifier having a non-linear signal response characteristic and which is located in a multi-stage amplifier network between a signal source and a load. The linearization is accomplished, as will be described in detail hereinbelow, by providing feedforward overcorrection to a preceding amplifier.

Figure 1:
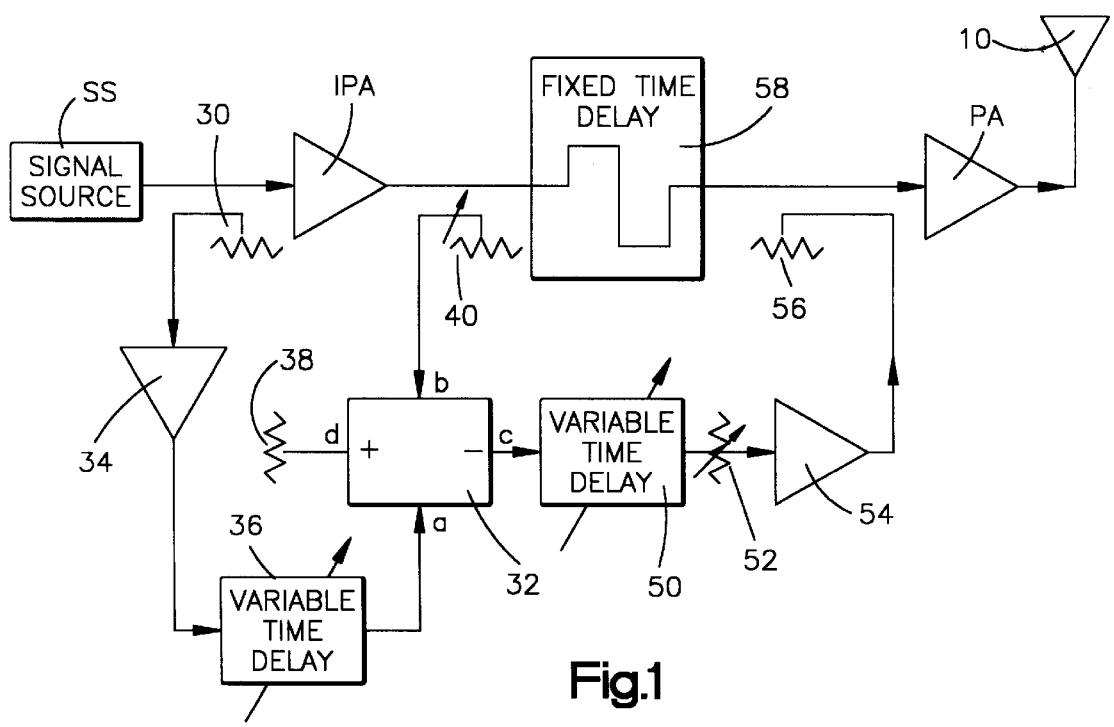
FIG. 1 is a schematic-block diagram illustration of an apparatus employed in one embodiment of practicing the invention.

In the amplifier network illustrated in FIG. 1 there is an output amplifier taking the form of a power amplifier PA and a preceding amplifier referred to herein as intermediate power amplifier IPA. These amplifiers are connected together in series in an amplifier network with the amplifiers being located between a signal source SS and a load, which is illustrated herein as an antenna 10. It is to be appreciated that the output amplifier need not be the very last stage but could well be an intermediate amplifier such as the intermediate amplifier IPA with the power amplifier PA together with the antenna 10 being considered as the load. As described in greater detail hereinafter with respect to FIG. 4, another version of the invention may involve employing an intermediate frequency amplifier located at a lower power stage in the network. In that example, the output amplifier is considered as the combination of an intermediate power amplifier IPA, a power amplifier PA and the antenna 10.

The procedure discussed below has particular application for use in improving linear amplification in a television transmitter. It is to be noted, however, that the invention herein may be applied to other situations wherein linear amplification is required. Such other situations may, for example, include single-sideband communication transmitters, cellular radio base station transmitters, and microwave transmitters.

In the embodiment to be described immediately below with respect to FIGS. 1, 2, and 3, the linearity of an output power amplifier PA is corrected by providing feedforward correction around the intermediate power amplifier IPA with a feedforward circuit.

In a network having a plurality of amplifiers such as that shown in FIG. 1 a preceding amplifier such as the intermediate power amplifier IPA is selected such that it exhibits a non-linear signal response characteristic similar to that of the output amplifier PA. That is, with reference to FIG. 2, curve 20 shows the IPA transfer curve before feedforward correction is applied. As seen, this curve is a non-linear curve showing that the output signal responds in a non-linear manner to the applied input signal. Curve 22 illustrates an IPA transfer curve after feedforward correction to provide a linear relationship of the output to the input. The output amplifier PA has a non-linear signal response characteristic similar to that of the curve 20 for amplifier IPA. The selected amplifier IPA also exhibits a non-linear signal response characteristic as evidenced by the by the IPA transfer curve 20. As will be brought out in greater detail hereinafter, the present invention contemplates adjusting the feedforward correction so that overcorrection is achieved as is indicated by the curve 24 which shows the IPA transfer curve after overcorrection.

Reference is again made to FIG. 1 in which it is seen that the feedforward circuit includes a directional coupler 30 which is employed to provide a sample of the input signal which is then applied to input a of a hybrid combiner 32 by way of an amplifier 34 and a variable time delay 36. A sample of the intermediate power amplifier IPA output signal is obtained with a variable directional coupler 40 and supplied to input b of the combiner 32. The combiner combines the signals applied to its inputs a and b and provides the vector difference of the signals at output c and the vector sum of the inputs at output d, which is terminated in a dummy load resistor 38.

The variable time delay 36 can be adjusted to compensate for the time delay through the intermediate power amplifier IPA. This permits a sample of the input signal and a sample of the output signal to arrive at the combiner inputs a and b in timed coincidence. The coupling factor, K2, of directional coupler 40 may be adjusted so that under nominal small signal conditions the two sample inputs are equal and in phase. The directional coupler 40 is employed for varying the magnitude of the output signal from the intermediate power amplifier IPA whereas the variable time delay 36 is employed for varying the time delay relationship between the two samples. If the samples are the same, then the difference output from the combiner at output terminal c is zero. The adjustment to the coupling factor K2 satisfies the following conditions:

$$K1 = (G1)(K2) \qquad \text{equation (1)}$$

where G1 represents the gain of the intermediate power amplifier IPA and K1 represents the coupling factor of directional coupler 30.

Under larger signal conditions, the gain (G1) of the intermediate power amplifier IPA will change and an error signal will be present at the output c of the hybrid combiner 32. This error signal is adjusted with a variable time delay 50 and the variable attenuator 52 and amplified by a linear amplifier 54 and combined with the intermediate power amplifier output signal by way of a directional coupler 56. The variable time delay 50 is adjusted so that the time delay through the correction path including delay 50, attenuator 52, and amplifier 54 matches the path in the output circuit of the amplifier IPA and this includes a fixed time delay 58.

The variable attenuator 52 is normally adjusted so that the gain from the output of the amplifier IPA through directional coupler 50, hybrid combiner 52, linear amplifier 54, and coupler 56 is unity. That is, in accordance with the following:

$$(K2)(G1)(K3) = 1 \qquad \text{equation (2)}$$

wherein gain G2 is the gain of the linear amplifier 54 and K3 is the coupling factor of the directional coupler 56. The gain G2 of the linear amplifier is taken to include the losses in the hybrid combiner 32 and the attenuator 52.

The feedforward signal serves to correct non-linearity in the intermediate power amplifier IPA. This is illustrated in FIG. 2 by noting that curve 20 represents the IPA transfer curve before correction. Curve 22 illustrates the IPA transfer curve after feedforward correction. This is a linear relationship of the output of the amplifier IPA with respect to the input. Properly adjusted, any amplitude non-linearity will be perfectly corrected. Any phase non-linearity will be substantially corrected. In this sense, phase non-linearity may be defined as a variation in phase shift through amplifier IPA as a function of the level of the input signal.

The description presented thus far is generally representative of the feedforward error correction technique presented in the aforementioned article by E. G. Silagi and the noted U.S. patents. That is, the feedforward correction provides correction of the intermediate power amplifier IPA so that the output signal obtained therefrom exhibits a substantially linear relationship to that of the input signal. This, however, has not provided any correction to compensate for the non-linear signal response characteristics of the output amplifier taking the form of the power amplifier PA. In accordance with the invention herein, the non-linearity in the transfer characteristic of the power amplifier PA is compensated for by feedforward overcorrection of the intermediate power amplifier IPA. The intermediate power amplifier IPA is selected so as to exhibit a non-linear signal response characteristic similar to that of the power amplifier PA. Hence, if the transfer curve characteristic of the power amplifier PA is similar to that of the intermediate power amplifier IPA, then the non-linear signal response characteristic of the power amplifier PA can be substantially corrected by adjusting the attenuator 52. For example, the attenuator 52 may be adjusted to have 6 dB less loss than that for perfect correction of the intermediate power amplifier IPA. In this situation, the corrected signal introduced through the directional coupler 56 will be twice as large (on a voltage basis) as is necessary to correct the intermediate power amplifier IPA. The additional amount of correction will be of the proper sense and magnitude to correct for the non-linearity characteristics of the power amplifier PA. This is seen from reference to FIG. 3 which illustrates a transfer curve 60 which illustrates the combined transfer curve of both the intermediate power amplifier IPA and the power amplifier PA before correction. After the overcorrection has been made to the intermediate power amplifier IPA, the combined transfer curve is illustrated by the curve 62 in FIG. 3 which provides a linear response of the output from the power amplifier PA relative to the input to the intermediate power amplifier IPA. The phase non-linearity in the power amplifier PA will be substantially corrected by this procedure.

Although it would be preferable that the non-linear signal response characteristics of the selected amplifier IPA be identical to that of the power amplifier PA, such a match is not required for this procedure to be effective. Substantial improvement in the linearity of the output amplifier may be achieved if only the general shape of its transfer curve is similar to that of the preceding amplifier to which feedforward overcorrection is applied. Both the variable attenuator 52 and the variable time delay 50 may be adjusted to minimize the non-linearity or distortion of the input power amplifier. For example, in a single-sideband communications transmitter, a two tone test single may be employed and adjustments may be made to the time delay 50 and the attenuator 52 with the results being viewed on a spectrum analyzer. In a HDTV digital television transmitter, the test signal may be a standard eight level VSB signal. The output from the power amplifier may be observed with a spectrum analyzer and adjustments are made to delay 50 and attenuator 52 to bring the adjacent channel interference within the FCC spectral mask.

In a conventional analog television transmitter, such as used in the U.S.A., a standard NTSC signal including an aural carrier (for common mode transmission) may be modulated by a ramp with superimposed chroma and applied to the combination of amplifiers IPA and PA. The resulting spectrum may be observed on an analyzer. In such case, there may be out-of-band intermodulation products observed at 0.92 mHz (difference between the aural and chroma carriers) below the vision carrier and 0.92 mHz above the aural carrier. Time delay 50 and attenuator 52 are adjusted to minimize these intermodulation products.

In summation, the procedure for linearizing an output amplifier, such as a power amplifier PA, involves the following steps. A lower power amplifier stage in the multistage amplifier network is selected with the selected amplifier stage exhibiting a non-linear response characteristic similar to that of the downstream or succeeding amplifier stage, to be corrected. Then, feedforward correction is applied around the lower power amplifier stage. The gain and phase of the two inputs to the hybrid combiner 32 are matched for small signal conditions. This is achieved by adjusting delay 36 and directional coupler 40. A match is obtained when there is no or minimum output signal at the output c of combiner 32. Next, sample the output of amplifier IPA at a point taken after the feedforward correction signal has been injected. This may be obtained by observing this output with a spectrum analyzer. The gain and time delay in the feedforward loop may be adjusted so that the input to the power amplifier PA is linearly related to the input to the intermediate power amplifier IPA. The lower power level stage is corrected. At this point, the output of the power amplifier may be examined as with a spectrum analyzer under normal signal conditions. Then, the gain and the delay of the feedforward loop is readjusted as by adjusting delay 50 and attenuator 52 to overcorrect the signal applied to the input of the power amplifier in such a manner that the output obtained from the power amplifier PA is essentially linearly related to that of the input supplied to the intermediate power amplifier IPA.

To further assist one skilled in the art in practicing the invention, several parameters of the circuit employed in FIG. 1 are set forth below. These parameters are set forth for illustrative purposes only and not for limiting the invention herein. The example presented in FIG. 1, is intended for use in high definition television (HDTV) wherein the input power to the intermediate power amplifier may be on the order of 0.01 watts. The gain G1 of the intermediate power amplifier may be on the order of 40,000 such that the output power is on the order of 400 watts. The coupling factor K1 of the directional coupler 30 may be on the order of −20 dB or K1=1/100. The coupling factor K2 of the directional coupler 40 may be on the order of −66 dB or K2=1/4,000,000. The gain from the input to the output of the intermediate power stage amplifier IPA may be on the order of +46 dB. Amplifier IPA may be several amplifier stages.

The gain G2 of the linear amplifier including attenuator 52 and combiner 32 may be on the order of 72 dB. The coupling factor K3 for the directional coupler 56 may be on the order of −6 dB or K3=¼. The loss from the output of the intermediate power amplifier IPA to the input of the power amplifier PA is on the order of 100 watts so that the input to the power amplifier is on the order of 300 watts. The power amplifier has a gain in excess of 100 and, consequently, the output of the power amplifier may be on the order of 40,000 watts. Thus, to provide feedforward correction around the power amplifier PA could be quite costly in such a high power environment. Because the feedforward loss is on the order of ¼ to ½ of the input signal, such correction is not normally employed at the power amplifier stage.

In the circuitry of FIG. 1 it may be assumed that amplifier 34 is not present. In such case the directional coupler has a gain of −20 dB. However, a directional coupler exhibiting a larger coupling factor, on the order of −30 to −40 dB is easier and cheaper to build. This would reduce the magnitude of the sample supplied to the hybrid combiner 32. The sample may be amplified as with amplifier 34 placed in the circuit from coupler 30 to the time delay 36. This amplifier may have a gain G3 such that the product of coupling factor K1 and the gain G3 would be equal to the product of the gain G1 and the coupling factor K2.

Figure 2:
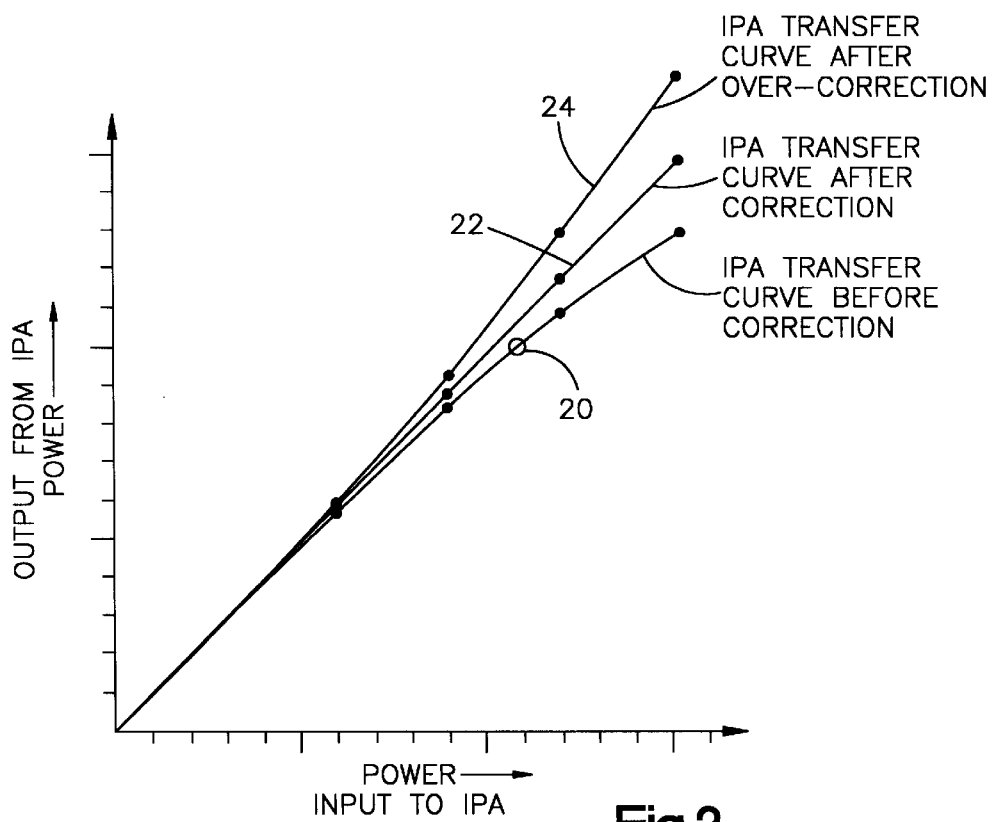
FIG. 2 is a graphical illustration of transfer curves of power input to power output which is useful in describing the invention herein.
Figure 3:
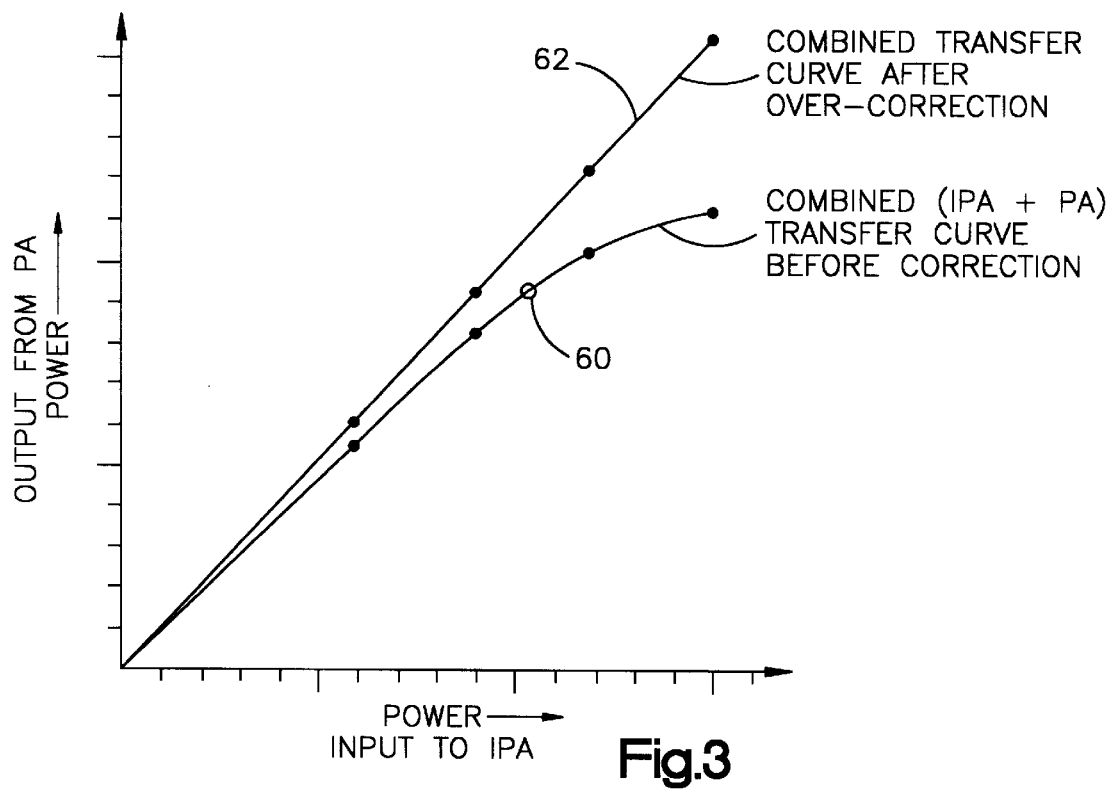
FIG. 3 is another graphical illustration of transfer curves of power input to power output which is useful in describing the invention herein.

The modified feedforward amplifier correction as discussed thus far with reference to FIGS. 1–3 has been with respect to compensating for the non-linear signal response characteristic of a power amplifier PA by providing feedforward overcorrection to a preceding intermediate power amplifier IPA. As discussed hereinbefore, this modified feedforward correction may be applied at an even earlier lower power amplifier stage than that of the amplifier IPA.

The signal source SS may include several intermediate frequency stages and the feedforward correction herein may be employed by providing overcorrection to one or more of these lower power intermediate frequency amplifier stages. This is illustrated in FIG. 4 discussed below.

Figure 4:
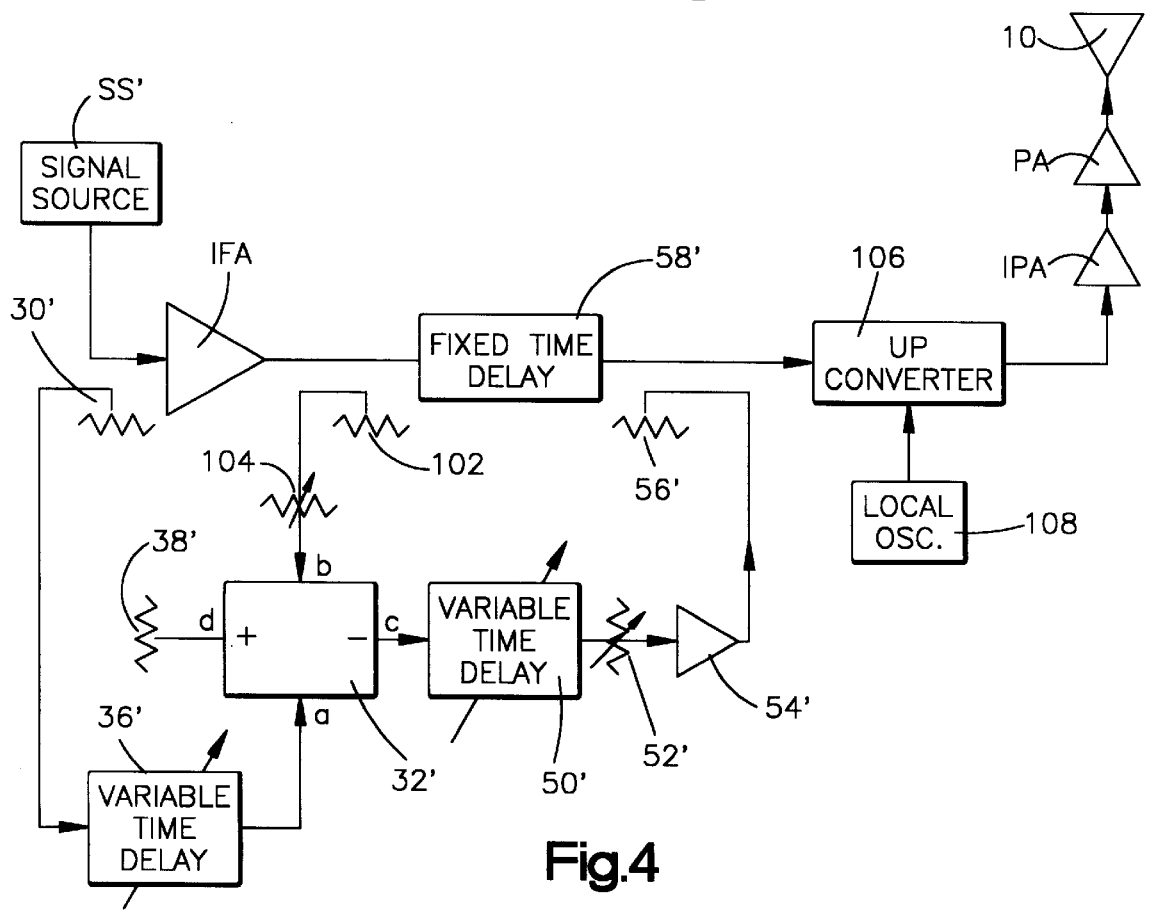
FIG. 4 is a schematic-block diagram illustration of other apparatus employed in practicing the invention.

The components in FIG. 4 that correspond to or are similar to those in FIG. 1 are identified with similar character references, as by employing a prime. That is, the signal source is source SS'. The signal source SS of FIG. 1 may include the signal source SS' of FIG. 4 and the intermediate frequency amplifier IFA of FIG. 4. Note that the variable coupler 40 in FIG. 1 is replaced by a fixed directional coupler 102 in FIG. 4 and the function of providing amplitude adjustment is provided by a variable attenuator 104 located between coupler 102 and the input to terminal b of the hybrid combiner 32'. This circuit includes an up-converter 106 located between the directional coupler 56' and amplifier IPA. The up-converter is coupled to a local oscillator 108.

The intermediate frequency amplifier IFA in FIG. 4 is selected so as to exhibit nonlinear signal response characteristics (phase and amplitude) similar to those of the intermediate power amplifier IPA and the power amplifier PA combined. The procedure is otherwise identical to that as discussed hereinbefore with reference to FIGS. 1, 2 and 3 with the exception that the output amplifier is now looked upon as being the combination of amplifiers IPA and PA. The procedure with the correction at the intermediate frequency level results in smaller and less expensive components because the power level is considerably lower, such as on the order of one milliwatt. There is great flexibility in designing amplifier IFA so that its nonlinear signal response characteristics match those of the amplifiers IPA and PA combined.

Another advantage of providing feedforward overcorrection at the intermediate frequency level is that the variable time delay 50' and the variable attenuator 52' may be controlled by an electronic controller. This permits adjustments to be made using a microprocessor base system.

Figure 5:
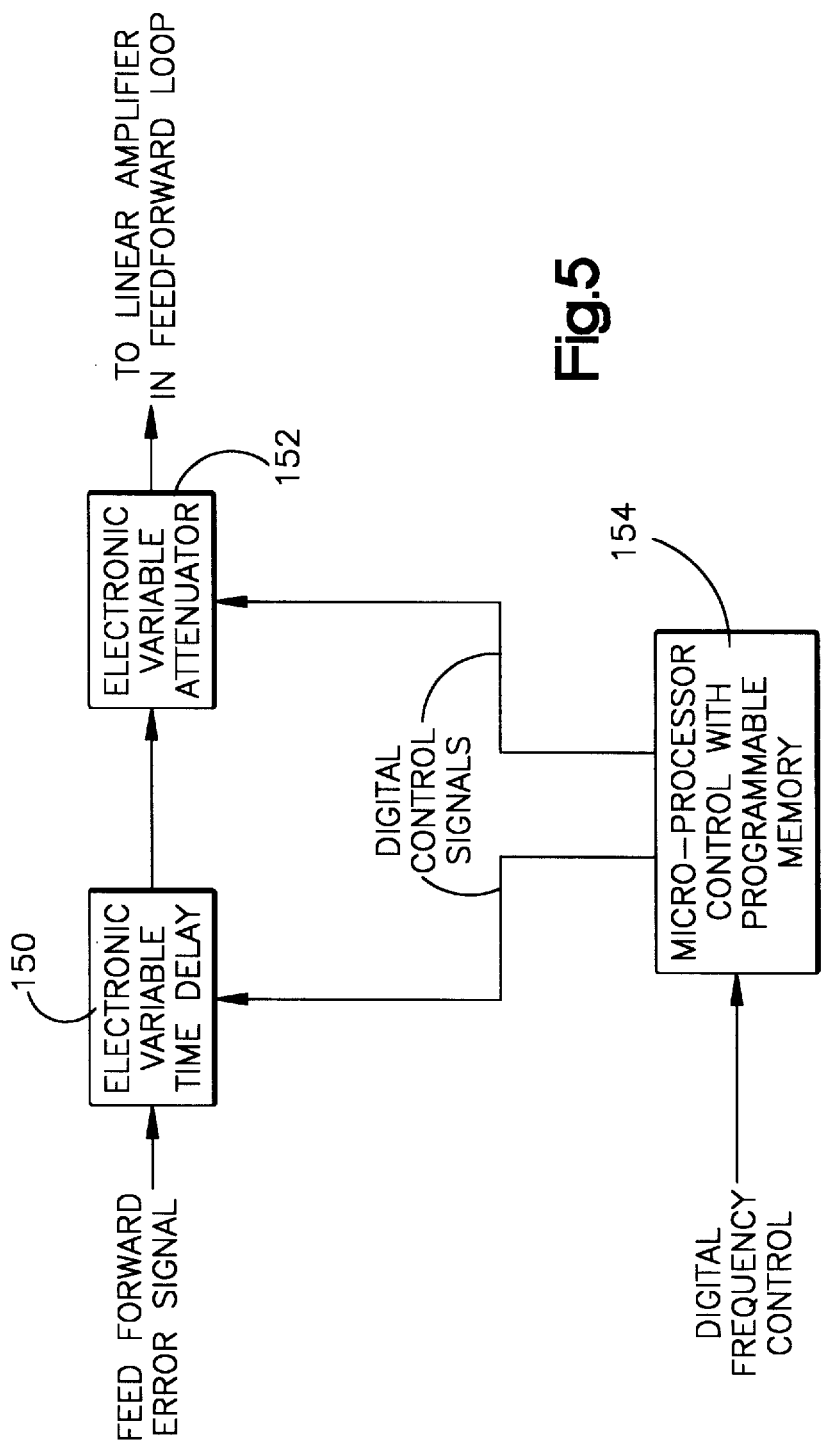
FIG. 5 is a schematic-block diagram illustration showing a modification to that illustrated in FIG. 4.

Reference is now made to FIG. 5 wherein the variable time delay 50' and the variable attenuator 52' of FIG. 4 are respectively replaced by an electronic variable time delay 150 and an electronic variable attenuator 152. The optimum settings of the time delay 150 and the attenuator 152 may be different at different operating frequencies. This is particularly useful with transmitters wherein the operating frequency is changed. The proper setting for the time delay and the attenuator are stored in a programmable memory of microprocessor 154. This microprocessor accepts as an input, digital frequency information representing the operating frequency to be employed and then provides the proper digital control signal for adjusting the delay 150 and the attenuator 152 for the selected operating frequency.

Such a broadcast transmitter may be used with different signal modulations. For example, in television service, NTSC analog signals may be transmitted during the day and HDTV digital signals may be transmitted at night. The optimum settings for delay 150 and attenuator 152 will be stored in memory and applied based on input control signals to the microprocessor or based on automatic determination of the signal characteristics.

Although the invention as been described in conjunction with preferred embodiments, it is to be appreciated that various modifications may be made without departing from the spirit and scope of the invention as defined by the appended claims.

Having described the invention, I claim the following:

1. A method of linearizing an output amplifying means having a non-linear signal response characteristic and located in a multi-stage amplifier network between a signal source and a load by providing feedforward correction to a preceding amplifying means comprising the steps of:

selecting a preceding amplifying means within said network wherein said preceding amplifying means exhibits a non-linear signal response characteristic similar to that of said output amplifying means;

applying an input signal to said selected preceding amplifying means to generate an intermediate output signal therefrom in which the intermediate output signal normally has a signal difference from that of said input signal as a function of the non-linear signal response characteristic of said selected preceding amplifying means;

combining at least a portion of said input signal with at least a portion of said intermediate output signal to obtain therefrom an error signal which represents said signal difference;

combining said error signal with said intermediate output signal in a manner so as to obtain a corrected intermediate output signal;

applying said corrected intermediate output signal to said output amplifying means to obtain an output signal therefrom;

adjusting said error signal in a direction to provide an overcorrected said intermediate output signal which has been overcorrected by an amount sufficient to compensate for the non-linear signal response characteristic of said output amplifying means whereby said output signal from said output amplifying means is essentially linearly related to said input signal; and wherein said step of selecting a preceding amplifying means includes selecting a preceding amplifying means operating at a lower frequency than that of said output amplifying means.

2. A method as set forth in claim 1 wherein said method of selecting a preceding amplifying means includes selecting a preceding amplifying means operating a lower power level than that of said output amplifier means.

3. A method of linearizing an output amplifying means having a non-linear signal response characteristic and located in a multi-stage amplifier network between a signal source and a load by providing feedforward correction to a preceding amplifying means comprising the steps of:

selecting a preceding amplifying means within said network wherein said preceding amplifying means exhibits a non-linear signal response characteristic similar to that of said output amplifying means;

applying an input signal to said selected preceding amplifying means to generate an intermediate output signal therefrom in which the intermediate output signal normally has a signal difference from that of said input signal as a function of the non-linear signal response characteristic of said selected preceding amplifying means;

combining at least a portion of said input signal with at least a portion of said intermediate output signal to obtain therefrom an error signal which represents said signal difference;

combining said error signal with said intermediate output signal in a manner so as to obtain a corrected intermediate output signal;

applying said corrected intermediate output signal to said output amplifying means to obtain an output signal therefrom;

adjusting said error signal in a direction to provide an overcorrected said intermediate output signal which has been overcorrected by an amount sufficient to compensate for the non-linear signal response characteristic of said output amplifying means whereby said output signal from said output amplifying means is essentially linearly related to said input signal; and including the step of up-converting the output frequency of said preceding amplifying means to a higher frequency than the normal operating frequency of said preceding amplifying means.

4. A method as set forth in claim 1 wherein the step of combining includes obtaining a sample of said input signal and then amplifying the magnitude thereof and applying the thus amplified sample signal to a combiner for combining said amplified sample signal with a portion of said intermediate output signal.

5. A method as set forth in claim 4 wherein said step of sampling said input signal includes the step of employing a directional coupler to obtain said signal sample.

6. A method as set forth in claim 1 wherein said step of adjusting said error signal includes applying said error signal to a variable time delay means.

7. A method as set forth in claim 1 wherein said step of adjusting said error signal includes the step of varying the magnitude of said error signal in a direction to provide said overcorrected intermediate output signal.

8. A method as set forth in claim 7 wherein said step of varying the magnitude of said error signal includes applying said error signal to variable attenuator means.

9. A method as set forth in claim 8 wherein said step of adjusting said error signal includes applying said error signal to a variable time delay means and combining said error signal with said intermediate output signal in a direction to provide said overcorrected intermediate output signal.

10. A method as set forth in claim 3 wherein the step of combining includes obtaining a sample of said input signal and then amplifying the magnitude thereof and applying the thus amplified sample signal to a combiner for combining said amplified sample signal with a portion of said intermediate output signal.

11. A method as set forth in claim 10 wherein said step of sampling said input signal includes the step of employing a directional coupler to obtain said signal sample.

12. A method as set forth in claim 3 wherein said step of adjusting said error signal includes applying said error signal to a variable time delay means.

13. A method as set forth in claim 3 wherein said step of adjusting said error signal includes the step of varying the magnitude of said error signal in a direction to provide said overcorrected intermediate output signal.

14. A method as set forth in claim 13 wherein said step of varying the magnitude of said error signal includes applying said error signal to variable attenuator means.

15. A method as set forth in claim 14 wherein said step of adjusting said error signal includes applying said error signal to a variable time delay means and combining said error signal with said intermediate output signal in a direction to provide said overcorrected intermediate output signal.

* * * * *